United States Patent
Tu et al.

(10) Patent No.: US 10,276,426 B2
(45) Date of Patent: Apr. 30, 2019

(54) SYSTEM AND METHOD FOR PERFORMING SPIN DRY ETCHING

(71) Applicant: Taiwan Semiconductor Manufacturing Co., Ltd., Hsin-Chu (TW)

(72) Inventors: Chih-Chiang Tu, Tauyen (TW); Chun-Lang Chen, Tainan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 40 days.

(21) Appl. No.: 15/204,761

(22) Filed: Jul. 7, 2016

(65) Prior Publication Data

US 2017/0345703 A1 Nov. 30, 2017

Related U.S. Application Data

(60) Provisional application No. 62/343,184, filed on May 31, 2016.

(51) Int. Cl.
  *H01L 21/687* (2006.01)
  *H01L 21/3065* (2006.01)
  *H01L 21/67* (2006.01)
  *H01J 37/32* (2006.01)

(52) U.S. Cl.
  CPC .. *H01L 21/68764* (2013.01); *H01J 37/32009* (2013.01); *H01J 37/32715* (2013.01); *H01L 21/3065* (2013.01); *H01L 21/67069* (2013.01); *H01L 21/68721* (2013.01); *H01L 21/68735* (2013.01); *H01L 21/68778* (2013.01); *H01J 2237/334* (2013.01)

(58) Field of Classification Search
  None
  See application file for complete search history.

(56) References Cited

U.S. PATENT DOCUMENTS

| | | | | |
|---|---|---|---|---|
| 4,400,235 A | * | 8/1983 | Coquin | H01L 21/68771 156/345.47 |
| 5,437,757 A | * | 8/1995 | Rice | H01L 21/68721 118/728 |
| 5,863,170 A | * | 1/1999 | Boitnott | H01L 21/6719 204/298.25 |

(Continued)

*Primary Examiner* — Allan W. Olsen
(74) *Attorney, Agent, or Firm* — Haynes and Boone, LLP

(57) ABSTRACT

A spin dry etching process includes loading an object into a dry etching system. A dry etching process is performed to the object, and the object is spun while the dry etching process is being performed. The spin dry etching process is performed using a semiconductor fabrication system. The semiconductor fabrication system includes a dry etching chamber in which a dry etching process is performed. A holder apparatus has a horizontally-facing slot that is configured for horizontal insertion of an etchable object therein. The etchable object includes either a photomask or a wafer. A controller is communicatively coupled to the holder apparatus and configured to spin the holder apparatus in a clockwise or counterclockwise direction while the dry etching process is being performed. An insertion of the etchable object into the horizontally-facing slot of the holder apparatus restricts a movement of the object as the dry etching process is performed.

20 Claims, 11 Drawing Sheets

(56) References Cited

U.S. PATENT DOCUMENTS

| | | | |
|---|---|---|---|
| 5,882,165 A * | 3/1999 | Maydan | H01L 21/67161 118/719 |
| 5,895,549 A * | 4/1999 | Goto | H01L 21/68742 118/503 |
| 6,080,272 A * | 6/2000 | Langley | H01J 37/32082 156/345.53 |
| 6,243,939 B1 * | 6/2001 | Chen | G11B 5/3163 216/22 |
| 6,406,589 B1 * | 6/2002 | Yanagisawa | H01J 37/32357 156/345.3 |
| 6,478,035 B1 * | 11/2002 | Niuya | B08B 3/12 134/133 |
| 6,979,521 B1 * | 12/2005 | Liu | G03F 1/50 430/321 |
| 8,464,186 B2 | 6/2013 | Wang et al. | |
| 8,468,473 B1 | 6/2013 | Wang et al. | |
| 8,473,877 B2 | 6/2013 | Wang et al. | |
| 8,507,159 B2 | 8/2013 | Wang et al. | |
| 8,510,687 B1 | 8/2013 | Liu et al. | |
| 8,524,427 B2 | 9/2013 | Shin et al. | |
| 8,530,121 B2 | 9/2013 | Wang et al. | |
| 8,563,224 B1 | 10/2013 | Chen et al. | |
| 8,584,057 B2 | 11/2013 | Liu et al. | |
| 8,601,407 B2 | 12/2013 | Wang et al. | |
| 8,609,308 B1 | 12/2013 | Chen et al. | |
| 8,627,241 B2 | 1/2014 | Wang et al. | |
| 8,628,897 B1 | 1/2014 | Lu et al. | |
| 8,677,511 B2 | 3/2014 | Wang et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,716,841 B1 | 5/2014 | Chang et al. | |
| 8,722,286 B2 | 5/2014 | Yu et al. | |
| 8,736,084 B2 | 5/2014 | Cheng et al. | |
| 8,753,788 B1 | 6/2014 | Yu et al. | |
| 8,762,900 B2 | 6/2014 | Shin et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,822,106 B2 | 9/2014 | Wang et al. | |
| 8,828,625 B2 | 9/2014 | Lu et al. | |
| 8,828,632 B2 | 9/2014 | Wang et al. | |
| 8,835,082 B2 | 9/2014 | Chen et al. | |
| 8,837,810 B2 | 9/2014 | Chen et al. | |
| 8,841,047 B2 | 9/2014 | Yu et al. | |
| 8,841,049 B2 | 9/2014 | Wang et al. | |
| 8,846,278 B2 | 9/2014 | Shin et al. | |
| 8,877,409 B2 | 11/2014 | Hsu et al. | |
| 9,406,535 B2 * | 8/2016 | Berry, III | H01L 21/67069 |
| 9,732,416 B1 * | 8/2017 | Stephens | C23C 16/4588 |
| 9,786,493 B2 * | 10/2017 | Ueda | H01L 21/0228 |
| 2001/0017184 A1 * | 8/2001 | Koeda | G01J 3/1838 156/233 |
| 2002/0158247 A1 * | 10/2002 | Mahanpour | H01L 21/31116 257/48 |
| 2004/0185751 A1 * | 9/2004 | Nakanishi | B24B 21/002 451/5 |
| 2004/0261944 A1 * | 12/2004 | Wakabayashi | B24B 37/345 156/345.12 |
| 2004/0266159 A1 * | 12/2004 | Gardecki | B23K 3/0623 438/613 |
| 2005/0214740 A1 * | 9/2005 | Ushio | G01N 33/48728 435/4 |
| 2005/0266657 A1 * | 12/2005 | Moriwaki | H01L 21/31111 438/455 |
| 2006/0234503 A1 * | 10/2006 | Yamada | B08B 1/04 438/667 |
| 2006/0260748 A1 * | 11/2006 | Nogami | C23C 16/5093 156/345.33 |
| 2007/0175860 A1 * | 8/2007 | Liu | G02B 5/1852 216/62 |
| 2008/0100983 A1 * | 5/2008 | Purohit | H01L 21/6831 361/234 |
| 2008/0179290 A1 * | 7/2008 | Collins | H01J 37/32357 216/67 |
| 2008/0179291 A1 * | 7/2008 | Collins | B08B 7/00 216/67 |
| 2011/0132874 A1 * | 6/2011 | Gottscho | H01J 37/32376 216/67 |
| 2011/0272874 A1 * | 11/2011 | Frank | H01L 21/68728 269/254 CS |
| 2011/0299218 A1 * | 12/2011 | Lee | H01L 21/6831 361/234 |
| 2012/0235036 A1 * | 9/2012 | Hatakeyama | G01N 23/2251 250/310 |
| 2012/0258408 A1 * | 10/2012 | Mayer | C25D 21/12 430/325 |
| 2012/0308112 A1 | 12/2012 | Hu et al. | |
| 2013/0118895 A1 * | 5/2013 | Roozeboom | C23C 16/0245 204/192.34 |
| 2013/0189849 A1 * | 7/2013 | Kato | H01L 21/0206 438/758 |
| 2013/0201461 A1 | 8/2013 | Huang et al. | |
| 2013/0202992 A1 | 8/2013 | Chen et al. | |
| 2013/0255569 A1 * | 10/2013 | Yamada | H01L 21/02104 117/107 |
| 2013/0258304 A1 | 10/2013 | Chang et al. | |
| 2014/0101624 A1 | 4/2014 | Wu et al. | |
| 2014/0111779 A1 | 4/2014 | Chen et al. | |
| 2014/0119638 A1 | 5/2014 | Chang et al. | |
| 2014/0123084 A1 | 5/2014 | Tang et al. | |
| 2014/0170859 A1 * | 6/2014 | Yamawaku | H01L 21/68764 438/778 |
| 2014/0226893 A1 | 8/2014 | Lo et al. | |
| 2014/0253901 A1 | 9/2014 | Zhou et al. | |
| 2014/0256067 A1 | 9/2014 | Cheng et al. | |
| 2014/0257761 A1 | 9/2014 | Zhou et al. | |
| 2015/0252477 A1 * | 9/2015 | Nguyen | C23C 16/24 427/569 |
| 2015/0286146 A1 | 10/2015 | Chang et al. | |
| 2015/0299856 A1 * | 10/2015 | Li | C23C 16/45534 216/37 |
| 2015/0309405 A1 | 10/2015 | Shih et al. | |
| 2015/0311075 A1 | 10/2015 | Huang et al. | |
| 2016/0024653 A1 * | 1/2016 | Forster | H01J 37/321 427/569 |
| 2016/0064260 A1 * | 3/2016 | Berry, III | H01L 21/67069 438/712 |
| 2016/0138161 A1 * | 5/2016 | Chen | H01J 37/32357 427/535 |
| 2016/0284532 A1 * | 9/2016 | Ueda | H01L 21/02164 |

\* cited by examiner

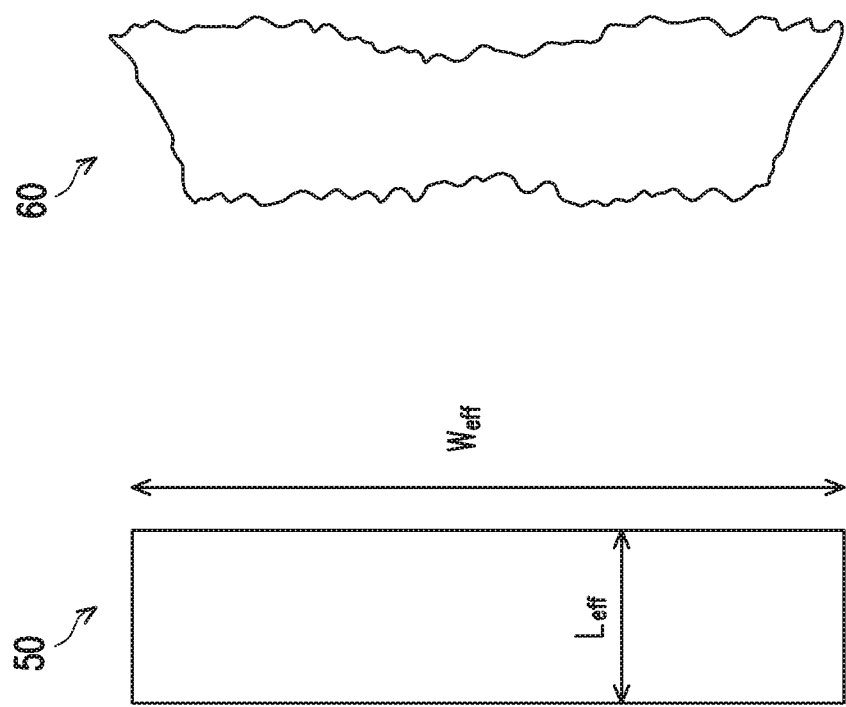

SYSTEM AND METHOD FOR PERFORMING SPIN DRY ETCHING

PRIORITY DATA

This application claims priority to Provisional Patent Application No. 62/343,184, filed May 31, 2016, and entitled "System and Method for Performing Spin Dry Etching," the disclosure of which is hereby incorporated by reference in its entirety.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the difficulties of IC processing and manufacturing. For example, in a typically dry etching process using plasma, the physical designs of the dry etching system—such as the placement of an exhaust pumping port location—may adversely impact the plasma distribution uniformity. This then leads to undesirable effects such as degraded lateral edge roughness (LER) or critical dimension (CD) uniformity for fabricated devices.

Therefore, while existing dry etching systems and processes have been generally adequate for their intended purposes, they have not been entirely satisfactory in every aspect. What is needed is a dry etching system and method that offers improved plasma distribution uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates example top views of a desired semiconductor device pattern and an actually fabricated semiconductor device pattern in accordance with some embodiments.

DETAILED DESCRIPTION

Figure 2A:
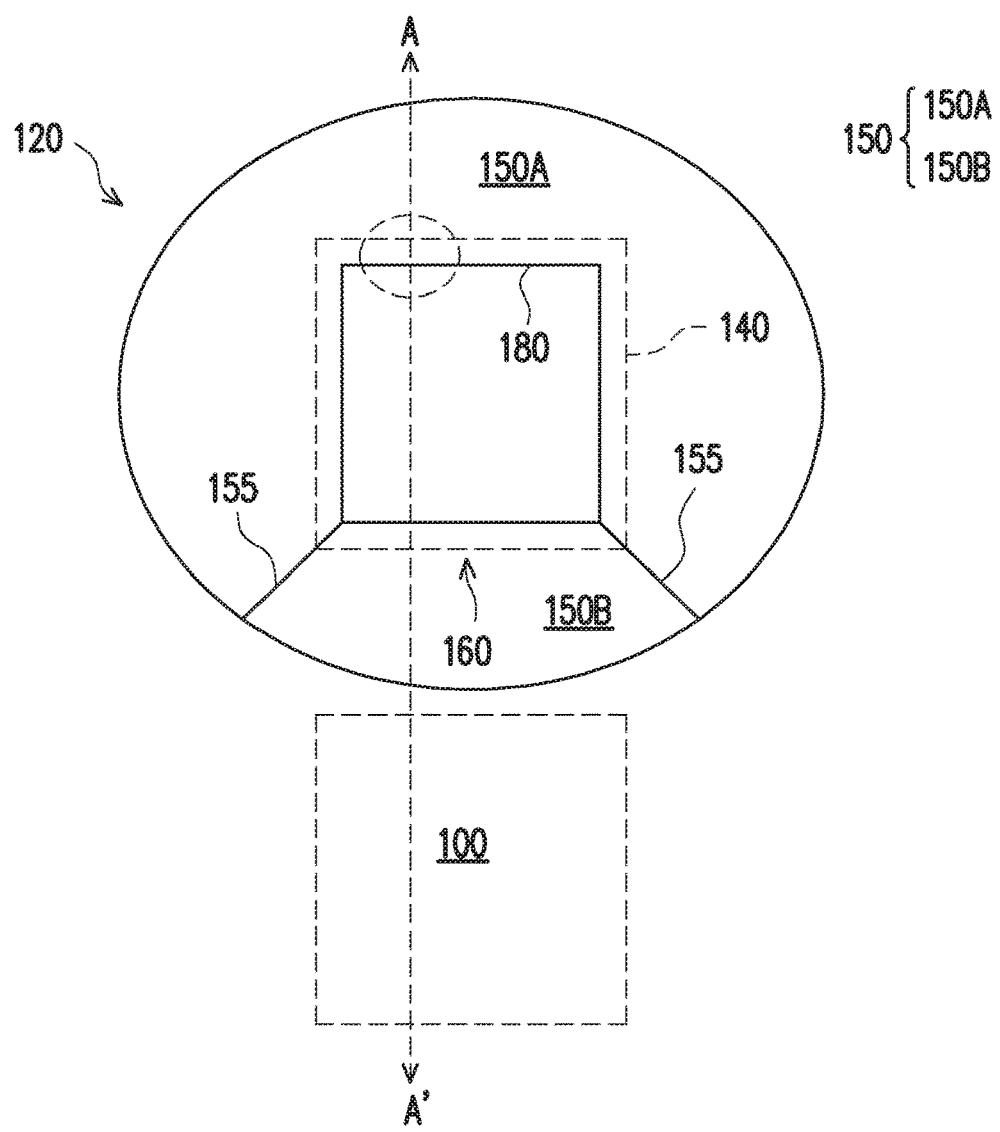
FIGS. 2A, 3A, 4A, 5A, and 6A are top views of a holder apparatus and an etchable object that is configured to be positioned in the holder apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication progresses to technology nodes requiring smaller geometry sizes and higher functional density, conventional lithography systems and methods may run into various problems. One of these problems is degraded uniformity caused by conventional dry etching systems and methods. In more detail, conventional dry etching is performed in a dry etching chamber, where plasma (e.g., an ionized gas) is applied to etch a desired object, which may be a photomask or a wafer. The object to be etched is placed in a holder, and the dry etching (using plasma) is anisotropic and does not involve reflow.

However, as device feature sizes continue to shrink, several problems may arise. For example, the conventional dry etching chamber design described above may be prone to device uniformity issues. Since the object to be etched is placed in a fixed position in the holder, the placement of an exhaust pumping port (so as to create a partial vacuum as a part of the dry etching process) has a significant impact on the distribution of the plasma. In other words, the density of the plasma may vary depending on the distance to/from the exhaust pumping port. In addition, the location of the etching gas injection may also affect the distribution of the plasma in the dry etching chamber (e.g., higher plasma density closer to the injection locations). Due to these factors, the plasma within the conventional dry etching chamber typically does not have good distribution uniformity. That is, some parts of the dry etching chamber may have a higher density of plasma, while other parts of the dry etching chamber may have a significantly lower density of plasma.

The lack of plasma distribution uniformity leads to problems in fabrication, such as lateral edge roughness (LER) or critical dimension (CD) uniformity. As an illustration, FIG. 1 provides top views (also referred to the contours) of an example device pattern as it is designed as well as after it has been fabricated. The device pattern 50 has an elongated rectangular shape in the top view, and it represents an ideal or desired pattern to be etched onto an object, be it a photomask or a wafer. In some embodiments, the device pattern 50 may represent (or correspond to) a gate of a transistor.

As is illustrated in FIG. 1, the dimensions of the gate $L_{eff}$ (effective length) and $W_{eff}$ (effective width) are both important parameters that may impact the semiconductor device's electrical or physical performance. As such, it is desirable for an actually fabricated device pattern to resemble the desired device pattern 50 as much as possible. Unfortunately, due to the lack of plasma distribution uniformity in a conventional dry etching chamber as discussed above, an actual device pattern 60 (e.g., after undergoing a conventional dry etching process) may have significant geometric deviations from the desired pattern 50. As can be seen from FIG. 1, rather than being a smooth straight line, the actual pattern 60 has jagged edges and various outward protrusions and inward indentations. This may be referred to as lateral edge roughness (LER). As the LER worsens, the effective gate length $L_{eff}$ and effective gate width $W_{eff}$ can no longer be accurately calculated. In addition, other problems such as increased leakage current may result.

Furthermore, as semiconductor device fabrication technology evolves, double patterning techniques are being used increasingly more often. The LER problems may be exacerbated in double patterning applications, since multiple etching processes are performed. The LER problems also lead to critical dimension uniformity, as different actually fabricated device patterns may have different widths or lengths as a result of the lack of the plasma distribution uniformity, for example due to the device patterns' locations on the photomask or wafer. The CD uniformity problems also adversely affect semiconductor device performance.

To overcome these issues associated with conventional dry etching systems and methods, the present disclosure involves an improved dry etching system and method, where the object to be etched (e.g., a photomask or a wafer) is spun or rotated as the dry etching process is performed. The spinning of the etchable object improves plasma distribution uniformity, which in turn improves LER and CD uniformity. The spin speed may also be carefully configured to achieve a desired lateral etching profile. The various aspects of the spin dry etching system and method are discussed below in more detail with reference to FIGS. 2-8.

Figure 2B:
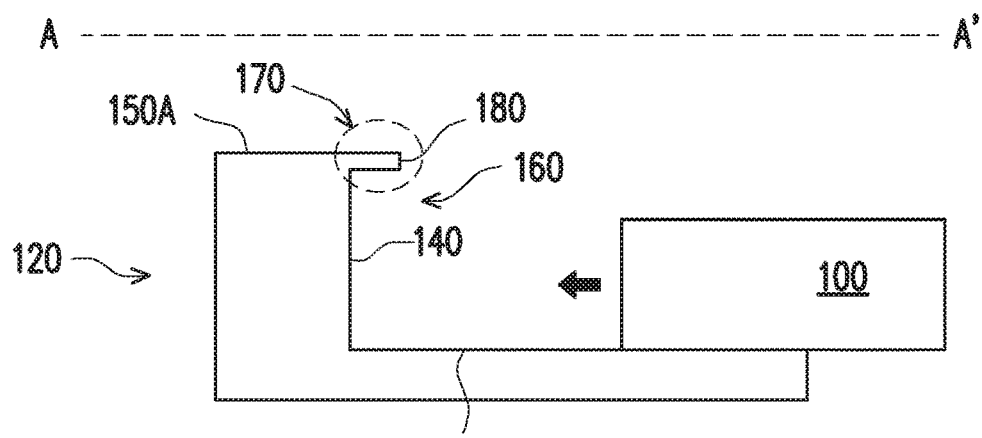
FIGS. 2B, 3B, 4B, 5B, and 6B are cross-sectional side views of the holder apparatus and the etchable object corresponding to FIGS. 2A, 3A, 4A, and 5A in accordance with some embodiments.
Figure 3A:
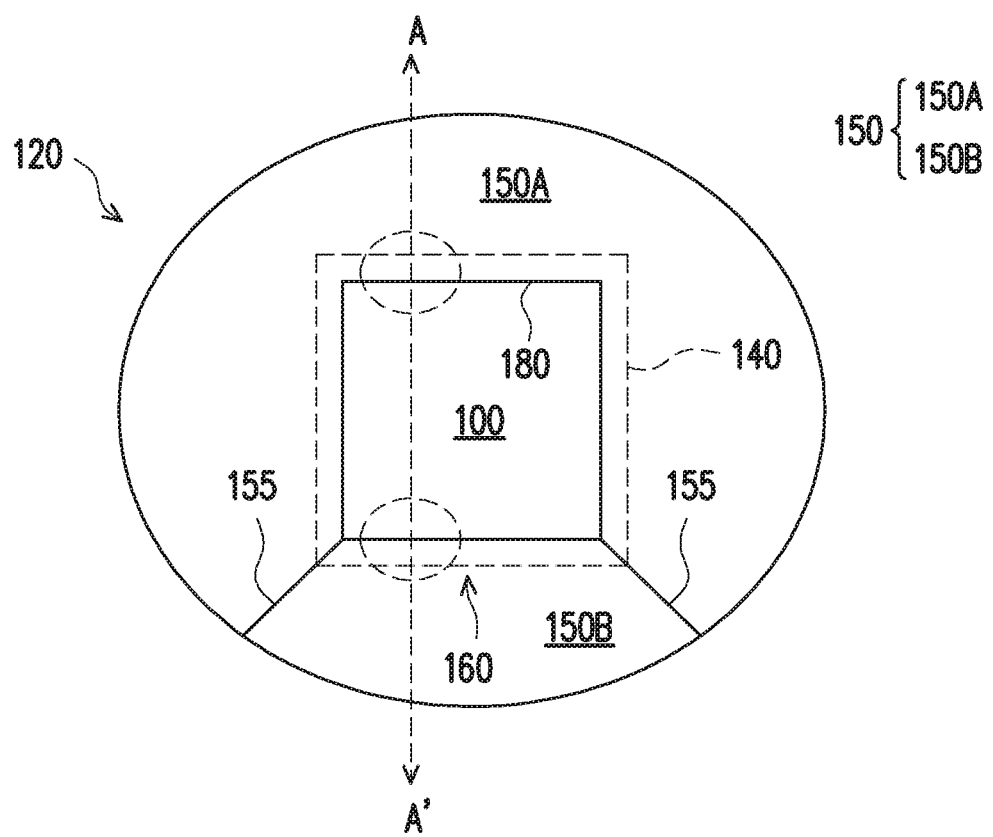
Figure 3B:
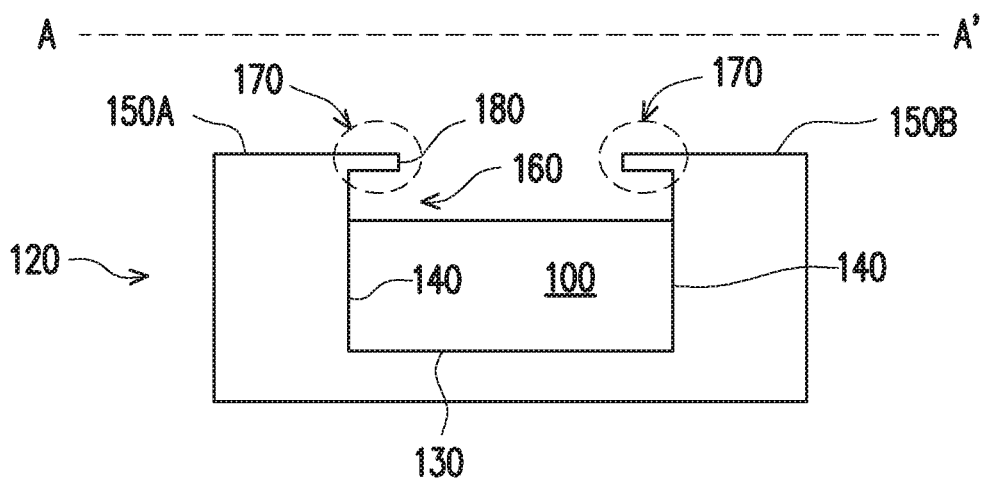

FIGS. 2A-2B and 3A-3B illustrate an object 100 to be dry etched as well as a holder apparatus 120 for securing the object 100 while it is dry etched, according to an embodiment of the present disclosure. In more detail, FIG. 2A is a simplified diagrammatic top view of the object 100 and the holder apparatus 120 prior to the insertion of the object 100 into the holder apparatus 120, FIG. 2B is a simplified diagrammatic fragmentary cross-sectional side view of the object 100 and the holder apparatus 120 prior to the insertion of the object 100 into the holder apparatus 120, FIG. 3A is a simplified diagrammatic top view of the object 100 and the holder apparatus 120 after the insertion of the object 100 into the holder apparatus 120, and FIG. 3B is a simplified diagrammatic fragmentary cross-sectional side view of the object 100 and the holder apparatus 120 after the insertion of the object 100 into the holder apparatus 120. It is understood that the cross-sectional side views of FIGS. 2B and 3B correspond to the top views of FIGS. 2A and 3A taken across the imaginary line from point A to point A'.

With reference to FIGS. 2A-2B, the object 100 includes a photomask in the illustrated embodiment. The photomask may be a photomask described in U.S. patent application Ser. No. 13/464,325, filed on May 4, 2012, entitled "Anisotropic Phase Shifting Mask", or it may be an EUV photomask described in U.S. patent application Ser. No. 14/736, 669, filed on Jun. 11, 2015, entitled "EUV Mask and Manufacturing Method by Using the Same", the disclosures of each of which are hereby incorporated by reference in their respective entireties. In the illustrated embodiments, the object 100 as a photomask may have a substantially square or rectangular shape (from a top view), though it is understood that other shapes are possible in alternative embodiments. In further embodiments, the object 100 may include a wafer, for example a silicon wafer. Regardless of the specific embodiment for the object 100, the dry etching process is intended to etch the object 100 to produce a pattern, for example to produce a gate line pattern (for a gate of a MOSFET transistor).

Still with reference to FIGS. 2A-2B, the holder apparatus 120 is composed of a ceramic material in some embodiments. The holder apparatus 120 has a mechanical structure or configuration that allows it to hold and spin the object 100, without risking the object 100 falling out or shifting in an undesirable manner during the spinning and dry etching thereof. In the illustrated embodiment, the holder apparatus 120 includes a bottom portion 130, a side portion 140, and a top portion 150, which collectively define a recess 160, which is a horizontally-facing slot. As shown in FIG. 2B, the object 100 is horizontally insert-able into the recess 160. In some embodiments, the object 100 is inserted to the point where a sidewall of the object 100 can make physical contact with the side portion 140. In other embodiments, a small distance (e.g., a distance ranging from 0.5 millimeter to 1.5 millimeter) separates the object 100 from the side portion 140.

The bottom portion 130 may be shaped as a flat plate on which the object 100 can be placed. That is, the bottom portion 130 comprises a substantially flat surface whose planar dimensions are slightly greater than the planar dimensions of the object 100. The side portion 140 is joined with the bottom portion 130 and comprises a substantially vertically flat wall, so as to restrict a lateral movement of the object 100 upon making physical contact with the object 100. An inner edge of the side portion 140 is illustrated as dotted or broken lines in the top view of FIG. 2A.

The top portion 150 includes two separate components 150A and 150B, as can be seen from the top view of FIG. 2A. The components 150A and 150B are separated by boundaries 155. The components 150A and 150B also collectively encircle an exposed area (e.g., the box shaped area in the middle) through which the object 100 can be dry etched. The component 150A is visible in the cross-sectional view of FIG. 2B, but the component 150B is hidden in the cross-sectional view of FIG. 2B. This is because in actual fabrication, the component 150B is removed first, and after the object 100 is positioned within the holder apparatus 120 (as discussed in further detail below), the component 150B is placed back on. Therefore, the component 150B is not shown in FIG. 2B to provide a clearer understanding of this process.

Still referring to FIG. 2B, the top portion 150 (that is, both the components 150A and 150B) comprises a laterally-protruding (or horizontally-protruding) segment 170 that is positioned above the object 100. The laterally-protruding segment 170 is shown as being surrounded by a dotted circle for visual emphasis. In some embodiments, this laterally-protruding segment 170 may be configured to move vertically up and down. This vertical movement allows the laterally-protruding segment 170 to "clamp down" on the object 100 once the object 100 is horizontally inserted into the recess 160. Therefore, the laterally-protruding segment 170 may also be interchangeably referred to hereinafter as a laterally-protruding (or horizontally-protruding) clamp 170.

An edge (or perimeter) 180 of the clamp 170 is also visible in the top view shown in FIG. 2A.

In some embodiments, the laterally-protruding clamp 170 has a horizontal dimension (e.g., width) of between 1 millimeter (mm) and 3 mm (for example 2 mm) and a vertical dimension (e.g., thickness) of between 2 mm and 8 mm (for example 5 mm). These dimensions are configured to optimize the main function of the clamp 170—to restrict the movement of the object 100 while the object 100 is spun—while also not covering up portions of the object that may need to be dry etched.

Referring now to FIGS. 3A and 3B, the object 100 is carefully loaded into the holder apparatus 120. The components that also appear in FIGS. 2A-2B are labeled the same in FIGS. 3A-3B, and for the sake of simplicity, not all of these components are discussed again with reference to FIGS. 3A-3B. In comparison to conventional holder apparatuses where the etchable object is loaded into a slot in the holder apparatus directly from the top (above the slot), the unique design of the holder apparatus 120 herein means that the object 100 has to be carefully loaded into the holder apparatus 120 by parallel transfer. In more detail, because of the presence of the horizontally-protruding clamp 170 (which helps define the horizontally-facing recess or slot 160), the object 100 needs to be inserted into the recess 160 horizontally. That is, the object 100 first makes contact with the bottom portion 130 of the holder apparatus 120, and away from the side portion 140 and the clamp 170. Thereafter, the object 100 is pushed laterally toward the side portion 140 (as indicated by the arrow shown in FIG. 2B) without scraping (or otherwise being blocked by) the clamp 170. The dimensions of the recess 160 are slightly larger than that of the object 100, so that the object 100 can be inserted therein.

In some embodiments, the full insertion of the object 100 into the horizontally-facing recess 160 means that a sidewall edge of the object 100 comes into direct physical contact with the flat wall of the side portion 140 of the holder apparatus 120. The laterally-protruding clamp 170 is also disposed above a region of the object 100 at this point. A distance separating the clamp 170 and the top surface of the object 100 is sufficiently small such that the clamp 170 and the object 100 may be considered to be almost making physical contact with one another. Again, the physical contact between the object 100 and the holder apparatus 120 (due to its wall and the clamp 170) helps restrict the movement of the object 100, for example movements involving tilting, rotation, or other position shifts, especially during the spinning and dry etching of the object 100.

The top view of FIG. 3A helps provide a visual illustration of the object 100 and the holder apparatus 120 after the object 100 has been properly loaded into the holder apparatus 120. An inner rectangle (drawn with solid lines) shown in FIG. 3A represents the outer edges 180 of the clamp 170. An outer rectangle (drawn with dotted lines) shown in FIG. 3A represents the outer edges or boundaries of the object 100. This is consistent with the fact that the clamp 170 is now located above (and covers up) a portion of the object 100. Therefore, while most of the object 100 is exposed and visible, the portion of the object 100 located directly below the clamp 170 is not directly visible in the top view of FIG. 3A.

Figure 4A:
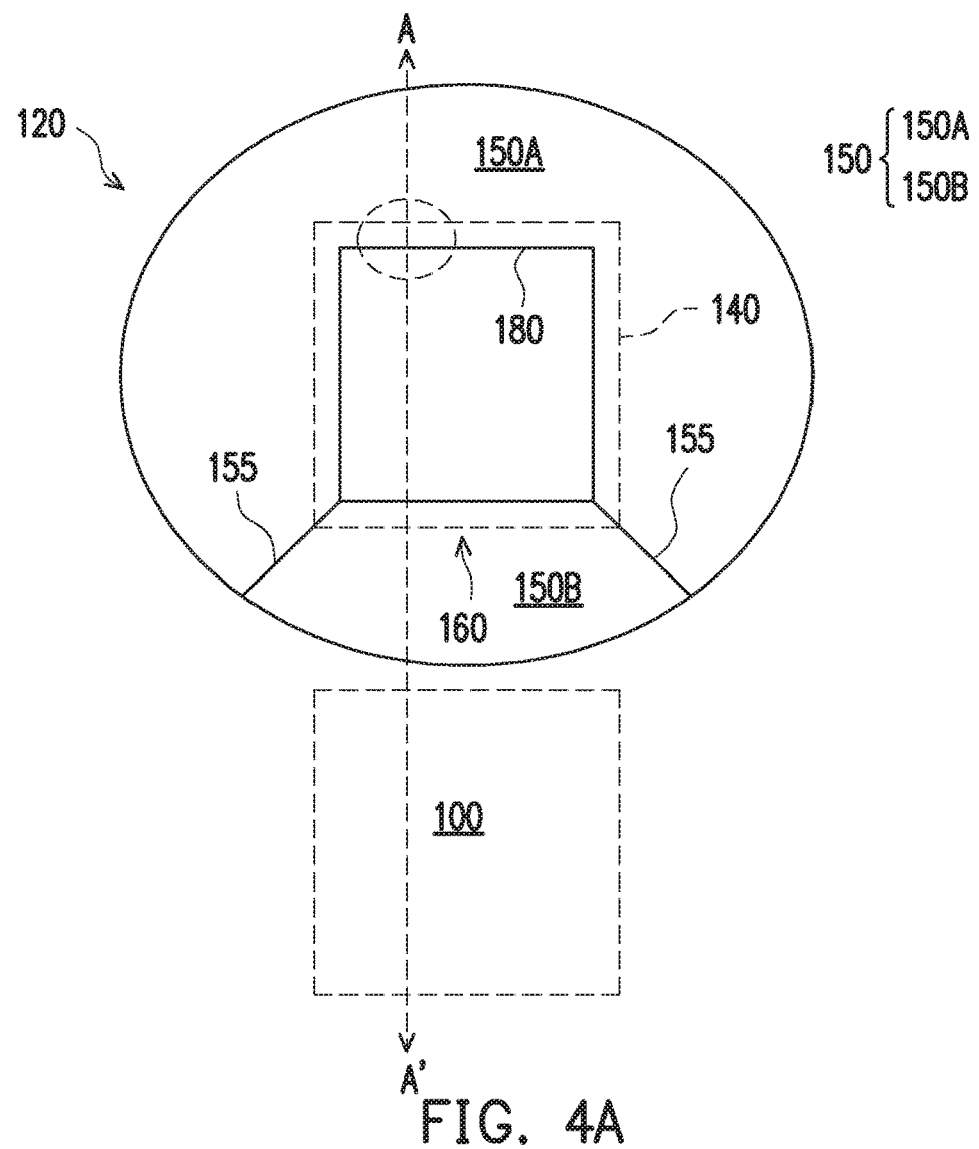
Figure 4B:
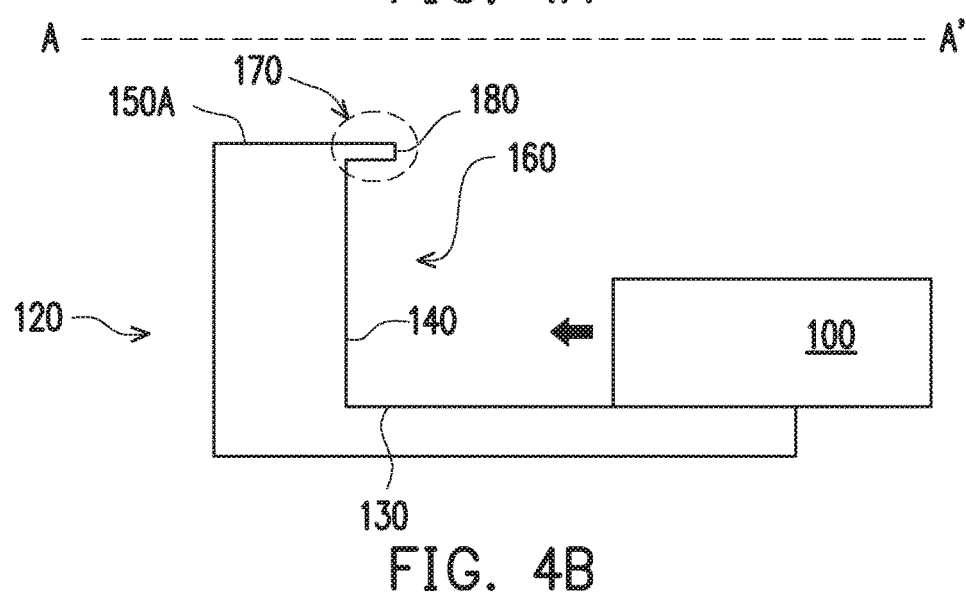
Figure 5A:
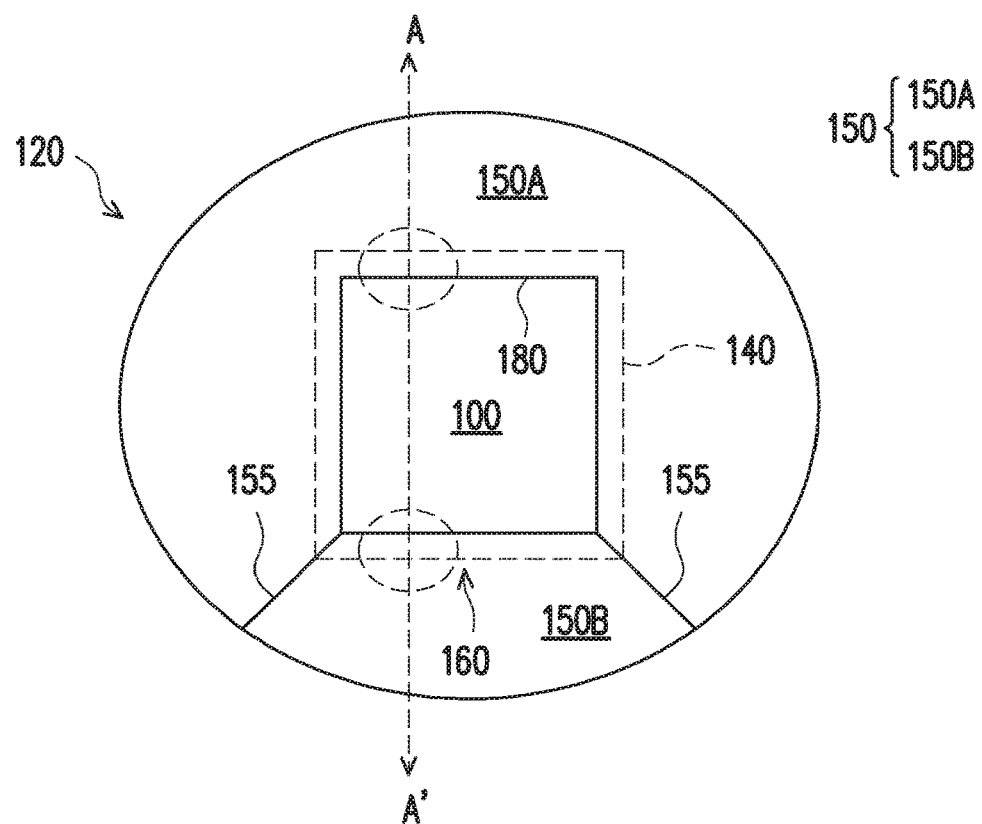
Figure 5B:
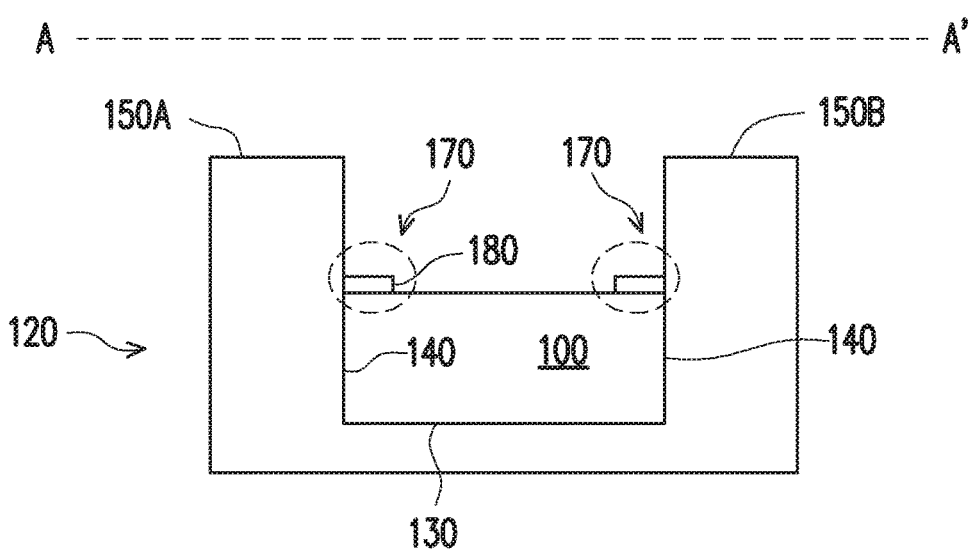

An alternative embodiment of the holder apparatus 120 is shown in FIGS. 4A-4B and 5A-5B. Again, for reasons of consistency and simplicity, the components that also appear in FIGS. 2A-2B or FIGS. 3A-3B are labeled the same in FIGS. 4A-4B and 5A-5B, and they are not necessarily discussed again with reference to FIGS. 4A-4B and 5A-5B. One feature of the embodiment shown in FIGS. 4A-4B and 5A-5B is that the clamp 170 is vertically movable. As such, the clamp 170 may be initially configured to be in an "up" position, for example at a position shown in FIG. 4B. While the clamp 170 remains in this "up" position, the object 100 is placed on the bottom portion 130 of the holder apparatus 120 and horizontally slid toward the side portion 140 until it makes physical contact with the side portion 140. After that, the clamp 170 is moved down vertically until a bottom surface of the clamp 170 makes physical contact with a top surface of the object 100, as shown in FIG. 5B. In this manner, the object 100 is "clamped down" by the clamp 170 acting in conjunction with the bottom portion 130. Again, the clamping down of the object 100 helps ensure that it does not move while it is spun and dry etched.

The vertical movability of the clamp 170 may make it easier for the horizontal insertion of the object 100, because the inadvertent damage to the object 100 (e.g., scraping of the upper surface of the object 100 caused by the clamp 170) is substantially reduced. Stated differently, when the clamp 170 is raised in the "up" position as shown in FIG. 4B, the recess 160 is wider (measured in the vertical direction) than it had been in the embodiment shown in FIG. 2B. This makes it easier for the object 100 to be inserted therein without getting scraped. After the insertion of the object 100 has been completed, the lowering of the clamp 170 can still ensure that the clamp 170 makes physical contact with the object 100, which restricts the undesirable movements of the object 100 in subsequent processes.

Figure 6A:
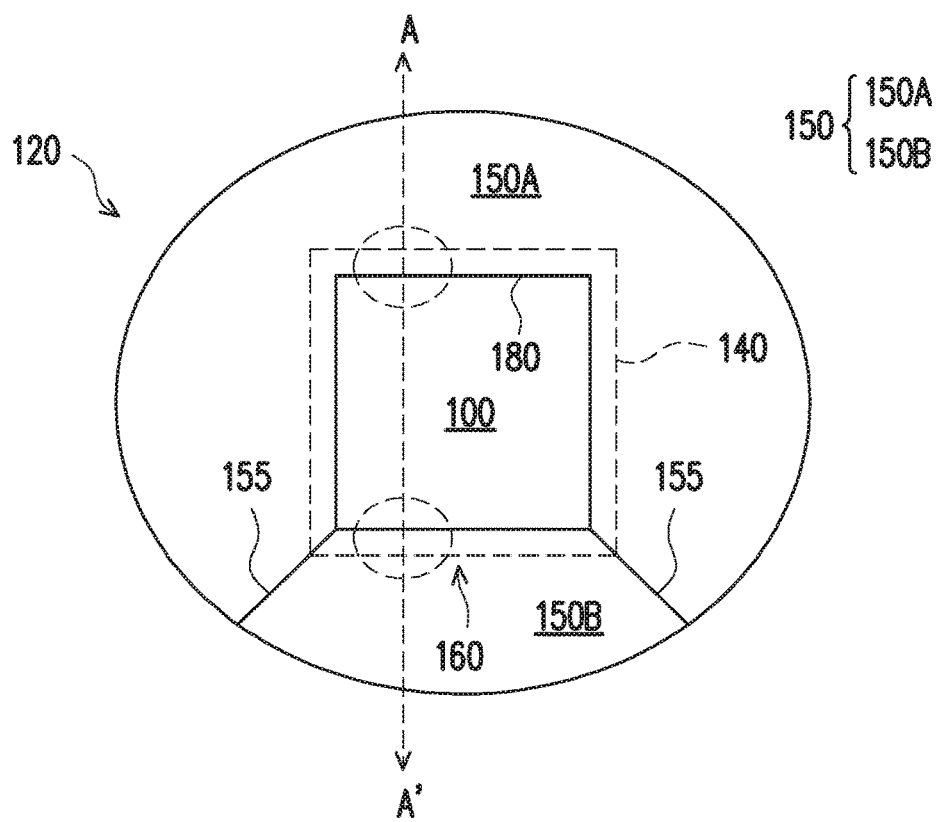
Figure 6B:
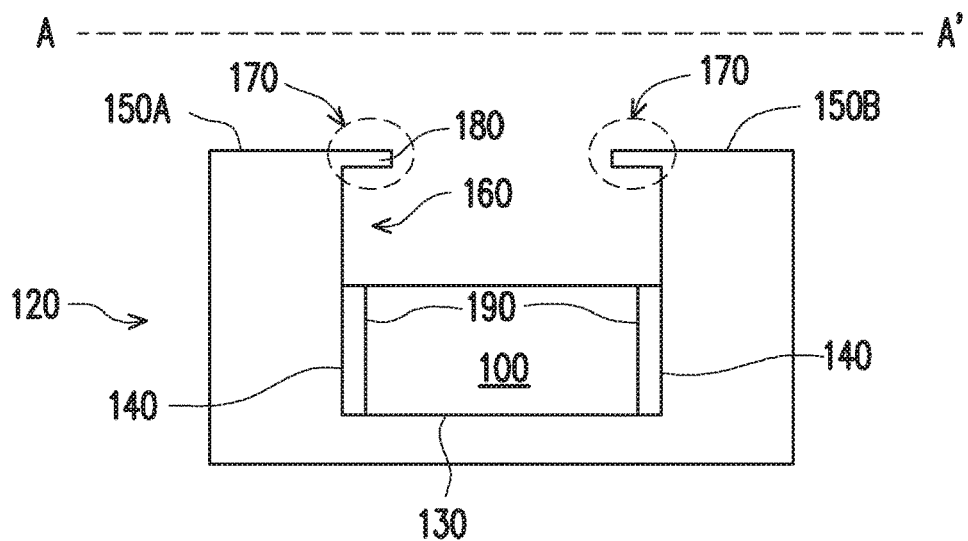

FIGS. 6A and 6B illustrate another alternative embodiment of the holder apparatus 120. Again, for reasons of consistency and simplicity, the components that also appear in FIGS. 2A-2B or FIGS. 3A-3B are labeled the same in FIGS. 6A-6B and are not necessarily discussed again. In the embodiment shown in FIGS. 6A and 6B, the holder apparatus 120 includes a buffer component 190 in the recess 160. The buffer component 190 is located on the sidewall of the side portion 140. The buffer component 190 enhances the physical contact between the object 100 and the holder apparatus 120. For example, the presence of the buffer component 190 allows the object 100 to fit more snugly into the holder apparatus 120. This further minimizes the risks of undesirable movement of the object 100 during the dry etching process. In some embodiments, the buffer component 190 includes an elastic material, such as a sponge-like material. In other embodiments, the buffer component 190 includes a hard material that is not elastic.

The dimensions of the buffer component 190 are also configured to optimize the physical contact between the object 100 and the holder apparatus 120. For example, the buffer component 190 may be as tall as (or taller than) the object 100. In some embodiments, the buffer component 190 has a lateral dimension (e.g., width) ranging between 0.5 mm and 1.5 mm, such as 1 mm. In the illustrated embodiment, a distance ranging between 2 mm and 4 mm (e.g., 3 mm) separates the buffer component 190 from the laterally-protruding clamp 170. In other embodiments, however, it is understood that the laterally-protruding clamp 170 may be lowered until it makes contact with the object 100 and/or the buffer component 190, similar to the embodiment illustrated in FIG. 5B.

Figure 7:
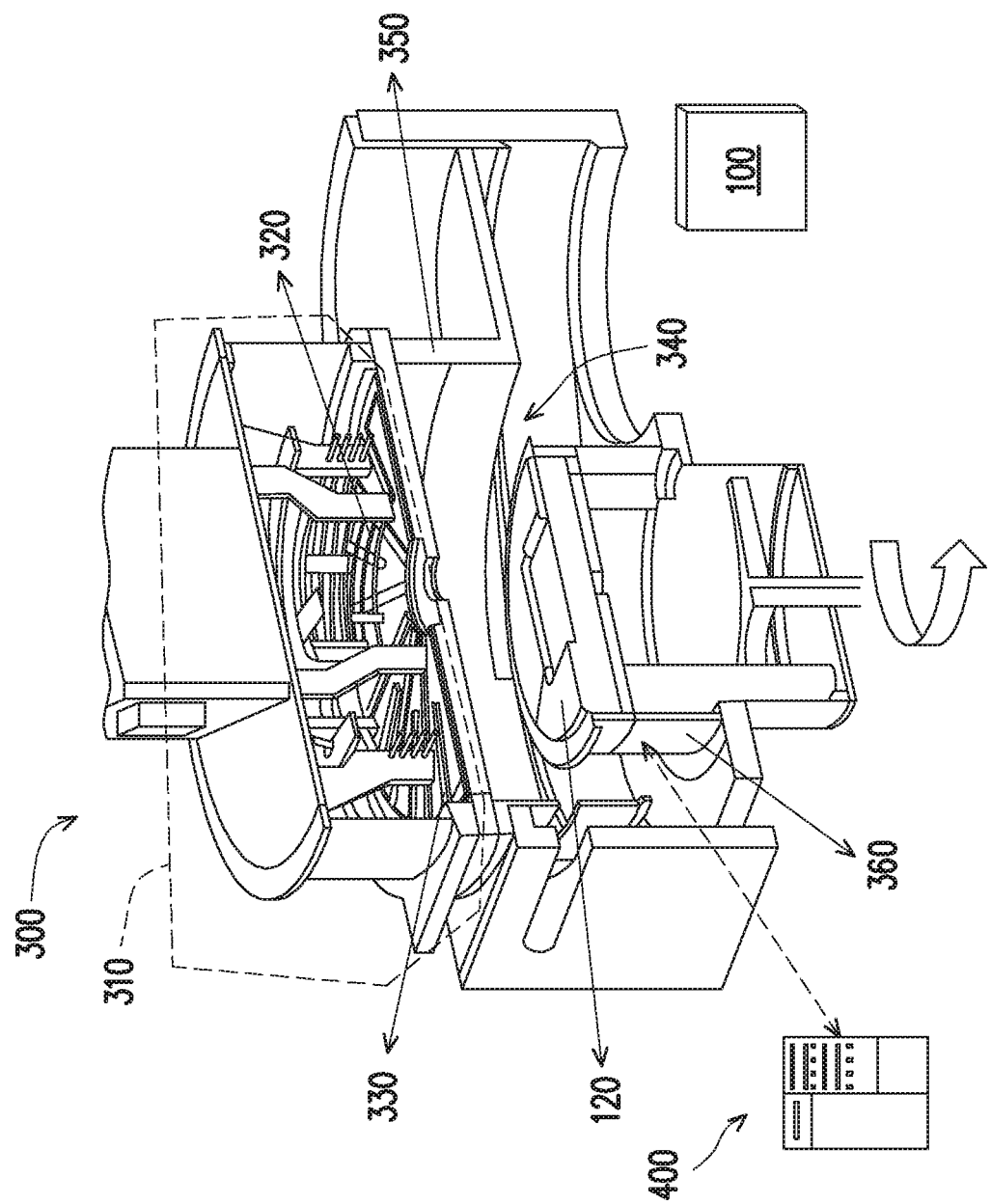
FIG. 7 is a diagrammatic view of a dry etching system capable of performing a spin dry etching process in accordance with some embodiments.

FIG. 7 is a three-dimensional perspective view of a dry etching system 300 according to an embodiment of the present disclosure. The dry etching system 300 includes an Induced Coupled Plasma (ICP, also referred to as Inductively Coupled Plasma) power generator 310. The ICP plasma generator 310 includes a plurality of coils 320 and antennas 330. An electrical voltage is generated by the ICP plasma power generator 310, which is supplied to the coils 320. The coils 320 produce an electro-magnetic field in response to the electrical voltage. The magnetic field induces electrical current for the antennas 330. Various etching gases may also be supplied into the dry etching system 300. As a result of these gases interacting with electrical current, plasma (used for dry etching) is generated.

The dry etching system 300 includes a dry etching chamber 340, the chamber walls of which are labeled as walls 350 herein. The holder apparatus 120 discussed above is placed in the etching chamber. An etchable object 100 discussed above can be placed within the holder apparatus 120, for example through the horizontal insertion method discussed above. The object 100 can then be etched by the plasma of the etching chamber 340. The holder apparatus 120 is attached to a pedestal 360. The pedestal 360 is configured to rotate or spin in a clockwise and/or a counterclockwise manner. Thus, as the pedestal 360 rotates or spins, so does the holder apparatus 120, and consequently the object 100 placed therein.

In some embodiments, the dry etching system 300 includes a controller 400. The controller 400 may be locally or remotely located from the rest of the dry etching system 300, and it may be a part of an overall semiconductor manufacturing system. The controller 400 may include electronic memory and one or more electronic processors configured to execute programming instructions stored in the electronic memory, which may involve an etching recipe. The controller 400, based on the etching recipe, controls the pedestal 360 or a motor coupled to the pedestal 360 to rotate or spin according to a specific spin speed, spin duration, and/or a spin direction (e.g., clockwise or counterclockwise).

The holder apparatus 120 spins along with the pedestal 360, as does the object 100 placed in the holder apparatus 120. Thus, the controller 400 can control the spin rate/speed of the object 100. In some embodiments, the controller 400 is configured to set a spin rate/speed of the object 100 in a range between about 1 RPM to about 100 RPM, for example between about 20 RPM and about 50 RPM. This range of the spin speed is optimized to enhance the plasma distribution uniformity (by the spin of the object 100) during dry etching while also not risking inadvertent movement of the object 100 (for example, if the object 100 is spun too fast).

It is understood that, in some embodiments, the pedestal 360 (and the motor attached thereto) and the holder apparatus 120 is "separated" from the dry etching chamber 340 in the sense that the pedestal 360 and the holder apparatus 120 spin, but the dry etching chamber 340 itself does not spin.

As discussed above, the laterally-protruding clamp 170 helps prevent a movement (e.g., tilting, positional shifts, or unintended rotation) of the object 100 during the dry etching process. This is beneficial, because otherwise the spinning of the object 100 while it is being dry etched may introduce errors. For example, the spinning of the object 100 may lead to unintended movements (had the clamp 170 not been implemented) of the object 100, which may cause a wrong region of the object 100 to be etched. However, since the clamp 170 restricts the movements of the object 100, even while the object 100 is spun at various spin speeds, the desired region of the object can still be dry etched without errors.

Compared to conventional dry etching systems using plasma, the etching system 300 has different process parameters such as power, bias voltage, gas flow, etc. This is because the spinning of the pedestal 360 and the object 100 changes the mechanics of the plasma dry etching. For example, the spin dry etching creates more collisions between electrons and other particles compared to conventional plasma dry etching systems where there is no spin. This means that the power for the etching system 300 can be lower compared to conventional plasma dry etching systems. Similarly, other plasma dry etching parameters may need to be reconfigured to take the spin discussed above into account.

In some embodiments, the spinning of the apparatus 120 and the object 100 occurs before the actual dry etching begins. For example, according to an example etching recipe, the following steps are performed in order: (1) Stable: inlet etching gas, start rotation of the object 100 (e.g., a photomask); (2) Ignition: power on the ICP power generator 310 and generate plasma; (3) Main etching: start the etching process in which the object 100 is dry etched while being spun; (4) Over etching: when step (3) stops, more etching time is extended to make sure no residue remains. (5) Power off the system 300.

According to the various aspects of the present disclosure, plasma distribution uniformity is also improved by spinning the pedestal 360 and the object 100 while dry etching is performed to the object 100. One reason for this improvement is that spinning of the pedestal 360 and the object 100 helps redistribute plasma throughout the dry etching chamber 340. As such, the plasma is not as susceptible to the uneven plasma distribution attributed to the location of the exhaust pump or the locations where the etching gases are supplied inside the dry etching chamber 340. In other words, the fact that an exhaust pump (that generates a lower than ambient pressure) or the etching gas injections have fixed locations do not adversely affect the plasma distribution uniformity as much as before, since the non-uniform plasma distribution can be corrected by the spinning of the holder apparatus 120 and the object 100.

In addition, the spinning of the object 100 during dry etching also affects a lateral etching of the object 100. Whereas conventional dry etching systems can only do anisotropic etching from top to bottom, the spinning of the object 100 allows the dry etching can also occur sideways or laterally. In fact, the spin speed/rate of the object 100 is correlated to the lateral etching profile. For example, a ratio of top etching to lateral etching (referred to as T/L etching ratio) can be adjusted by configuring the spin speed/rate of the object 100. The faster the spin speed, the smaller the T/L ratio. As an example, in some embodiments, a spin speed of about 5 revolutions-per-minute (RPM) results in a T/L etching ratio of about 1:0.1 (that is, 1 part top etching for 0.1 part lateral etching), whereas a spin speed of about 100 revolutions-per-minute (RPM) results in a T/L etching ratio of about 1:2 (that is, 1 part top etching for 2 parts lateral etching). It is understood, however, that these ranges and ratios may be configured differently in other embodiments, but the concept is that changing the spin rate does have an impact on the T/L etching ratio, and that the spin rate can be specifically configured to achieve a desired lateral dry etching profile.

Figure 8A:
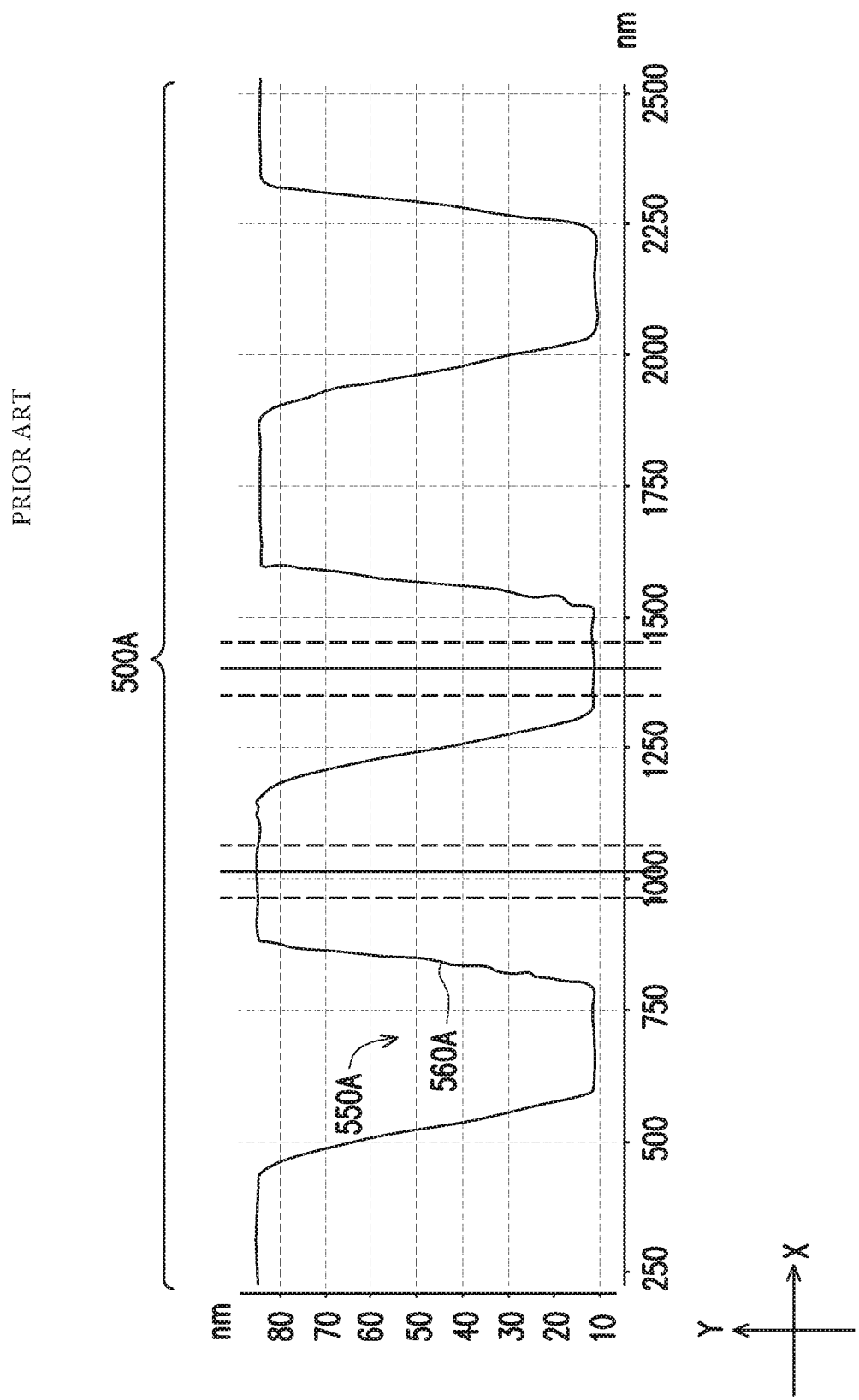
FIGS. 8A, 8B, and 8C are cross-sectional views illustrating an example correlation between dry etching profiles and spin speeds in accordance with some embodiments.
Figure 8B:
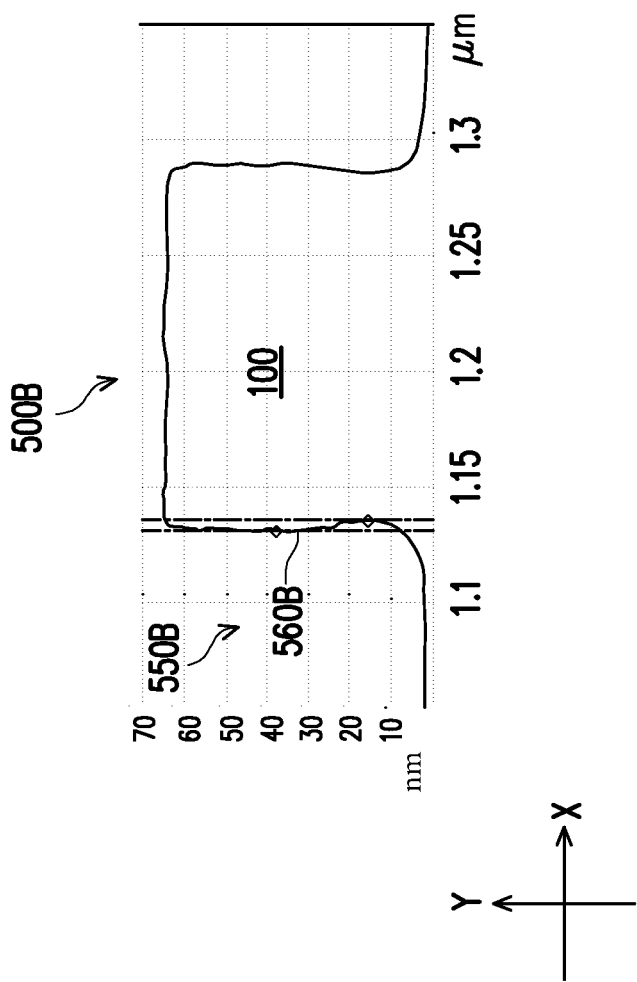
Figure 8C:
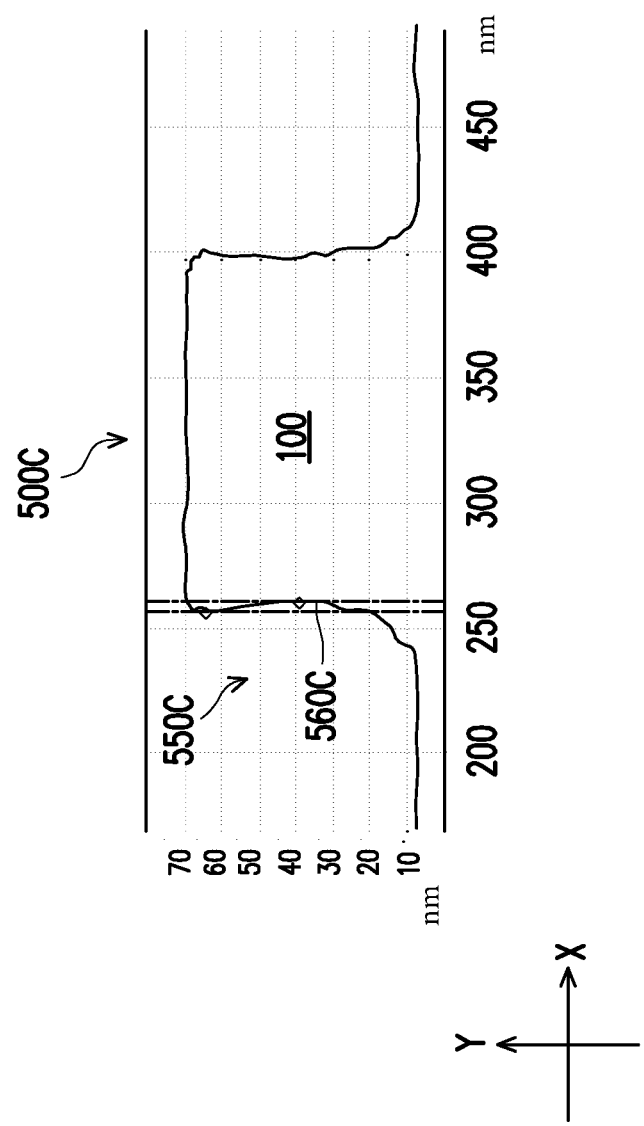

FIGS. 8A, 8B, and 8C are provided as examples to illustrate the relationship between the spin speed of the object 100 and the lateral etching profile. In more detail, FIG. 8A corresponds to a conventional dry etching system where the object being etched is not spun (i.e., a spin speed of 0), FIG. 8B corresponds to an embodiment of the dry etching system 300 where the object 100 is spun at a speed of 5 RPM, and FIG. 8C corresponds to an embodiment of the dry etching system 300 where the object 100 is spun at a speed of 20 RPM.

The FIGS. 8A, 8B, and 8C contain graphs 500A, 500B, and 500C, respectively. Each of the graphs 500, 510, and 520 represents a resulting portion of the object 100 after the dry etching has been performed. In other words, an X-axis in the graphs 500A/500B/500C represents a horizontal dimension (e.g., width) on the etched object 100, and the Y-axis in the graphs 500A/500B/500C represents a vertical dimension (e.g., height) on the etched object 100. The etched away portion of the object forms a respective trench (or recess) 550A/550B/550C in the etched object as shown in FIGS. 8A/8B/8C. It can be seen that these trenches have different shapes and different sidewall profiles. In FIG. 8A (i.e., with no spin), the trench 550A approximately resembles an upside-down trapezoid, and its sidewall 560A is relatively straight. In FIG. 8B (i.e., with a spin rate of 5 RPM), the trench 550B resembles more of a rectangle, but a bottom portion of its sidewall 560B extends further out away from the trench (or caves in toward the object 100). In FIG. 8C (i.e., with a spin rate of 20 RPM), the trench 550C also resembles a rectangle, but its sidewall 560C extends further out away from the trench compared to that of the sidewall 560B.

Based on these examples, it can be seen that the lateral etching increases as the spin speed of the etched object increases, as the graph 500A exhibits the least amount of lateral etching (due to having no spin), and the graph 500B exhibits a medium amount of lateral etching (due to having a relatively slow spin speed), and the graph 500C exhibits the most significant amount of lateral etching (due to having a relatively fast spin speed, at least among the three examples). In fact, the etched sidewall profile of the object can be controlled by configuring the spin speed of the object 100. In this manner, a desired etching sidewall profile can be achieved, which would have been impossible using conventional dry etching systems. For at least this reason, the present disclosure can offer improved semiconductor fabrication performance such as lateral edge roughness (LER) or critical dimension (CD) uniformity.

It is understood that the spinning of the holder apparatus 120 (and consequently the object 100) during dry etching need not be only in one direction. Instead of performing the spin in just the clockwise direction or just in the counter-clockwise direction, the dry etching of the present disclosure may be performed while the object 100 undergoes a combination of clockwise and counterclockwise spins. For example, the object 100 may be configured to spin in a clockwise direction for an X number of seconds, followed by a spin in the counterclockwise direction for a Y number of seconds (where Y may be the same as X or may be different), or vice versa. The combination of performing clockwise spins and counterclockwise spins in an alternating manner may further enhance the plasma distribution uniformity in the etching chamber, and therefore may further improve the dry etching performance. As a result, lateral edge roughness (LER) or critical dimension (CD) uniformity may be further improved.

Figure 9:
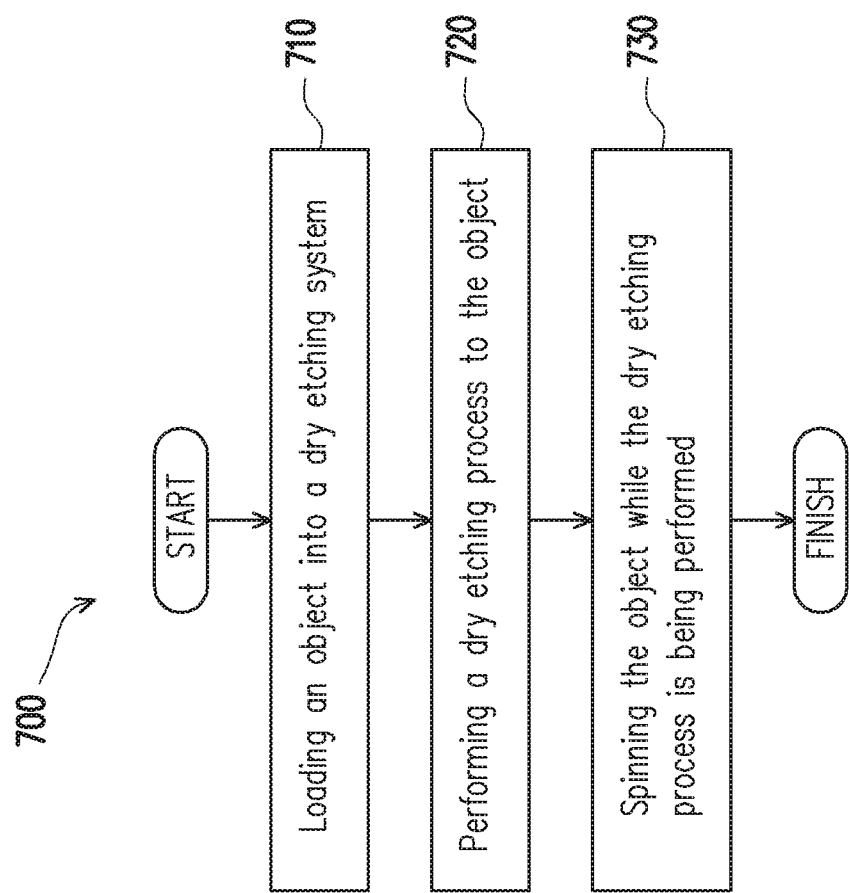
FIG. 9 is a flowchart of a method of performing spin dry etching in accordance with some embodiments.

FIG. 9 is a flowchart illustrating a simplified method 700 of performing a spin dry etching process. The method 700 includes a step 710 of loading an object into a dry etching system. In some embodiments, the object comprises a photomask. In other embodiments, the object comprises a wafer.

The method 700 includes a step 720 of performing a dry etching process to the object.

The method 700 includes a step 730 of spinning the object while the dry etching process is being performed.

In some embodiments, the loading of the object comprises horizontally inserting the object into a lateral recess of a holder apparatus, the lateral recess restricting a movement of the object during the spinning. In some embodiments, the lateral recess is defined at least in part by a laterally-protruding clamp that is positioned above the object once the object is inserted into the lateral recess. In some embodiments, the laterally-protruding clamp is vertically movable, wherein the loading of the object further comprises vertically moving the laterally-protruding clamp until the laterally-protruding clamp comes into physical contact with an upper surface of a portion of the object.

In some embodiments, the spinning the object comprises spinning the object in a first direction, followed by spinning the object in a second direction. One of the first direction and the second direction is a clockwise direction, and another one of the first direction and the second direction is a counterclockwise direction.

In some embodiments, the spinning the object comprises spinning the object at a rate of between 1 revolution-per-minute (RPM) and 100 RPM.

It is understood that additional fabrication processes may be performed before, during, or after the steps 710-730 of FIG. 9. For example, the method 700 may include additional steps of performing other dry etching or wet etching processes, or deposition, etc. Other fabrication processes are not discussed in detail herein for reasons of simplicity.

Based on the above discussions, it can be seen that the present disclosure offers various advantages in dry etching. It is understood, however, that not all advantages are necessarily discussed herein, and other embodiments may offer different advantages, and that no particular advantage is required for all embodiments.

One of the advantages is the improved dry etching performance. The spinning of the object being etched (and the holder apparatus) increase the plasma collision inside the chamber, compared to conventional dry etching systems. The spin minimizes the unevenness in plasma distribution caused by the exhaust pump port and the etching gas injection locations. The more evenly distributed plasma helps improve lateral edge roughness and critical dimension uniformity. Lateral etching profile is also improved by the spin. In fact, a controllable lateral etching profile may be achieved through carefully configuring the spin speed. Meanwhile, the novel and unique holder apparatus design (e.g., with the laterally-protruding clamp) helps prevent position shifts of the etchable object during dry etching, thereby reducing potential errors. Furthermore, the processes discussed herein are simple and easy to perform and are compatible with existing process flow.

The present disclosure provides for a method of performing a dry etching process. An object is loaded into a dry etching system. A dry etching process is performed to the object. The object is spun while the dry etching process is being performed.

The present disclosure provides for a dry etching apparatus. The dry etching apparatus includes a dry etching chamber. The dry etching apparatus also includes a holder apparatus configured to hold an object to be dry etched. The holder apparatus is configured to be rotated in a clockwise direction or in a counterclockwise direction while the object undergoes dry etching.

The present disclosure provides for a semiconductor fabrication system. The semiconductor fabrication system includes a dry etching chamber in which a dry etching process is performed. The semiconductor fabrication system includes a holder apparatus having a horizontally-facing slot that is configured for horizontal insertion of an etchable object therein, the etchable object including a photomask or a wafer. The semiconductor fabrication system includes a controller that is communicatively coupled to the holder apparatus. The controller is configured to spin the holder apparatus in a clockwise direction or in a counterclockwise direction while the dry etching process is being performed. An insertion of the etchable object into the horizontally-facing slot of the holder apparatus restricts a movement of the object while the holder apparatus being spun as the dry etching process is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   loading an object into a dry etching system by horizontally inserting the object into a lateral facing recess of a holder apparatus of the dry etching system;
   performing a dry etching process to the object; and
   spinning the object in a first direction for more than 360 degrees and at a rate between 20 revolution-per-minute (RPM) and 50 RPM but not in a second direction opposite the first direction while the dry etching process is being performed.

2. The method of claim 1, wherein the object comprises a photomask.

3. The method of claim 1, wherein the object comprises a wafer.

4. The method of claim 1, further comprising restricting a lateral movement of the object by a side wall of the lateral facing recess during the spinning.

5. The method of claim 4, further comprising accommodating the object in the lateral facing recess under a laterally-protruding clamp.

6. The method of claim 5, wherein the loading of the object further comprises lowering the laterally-protruding clamp until the laterally-protruding clamp comes into physical contact with an upper surface of a portion of the object.

7. The method of claim 1, further comprising: spinning the object before the dry etching process is performed.

8. The method of claim 1, wherein the spinning redistributes a plasma in a chamber in which the dry etching process is performed.

9. A method of etching, comprising:
   loading an object into an etching chamber;
   dry etching the object in the etching chamber by supplying a plasma to the etching chamber;
   redistributing the plasma throughout the etching chamber by rotating the object in a clockwise direction or in a counterclockwise direction during the dry etching; and
   configuring a spin speed of the object to adjust a top vs. lateral etching ratio of the dry etching.

10. The method of claim 9, wherein the loading and the dry etching comprise loading a photomask and dry etching the photomask, respectively.

11. The method of claim 9, wherein the loading and the dry etching comprise loading a wafer and dry etching the wafer, respectively.

12. The method of claim 9, wherein the loading the object comprises inserting the object horizontally into a lateral recess of a holder, and restricting a lateral movement of the object by a side wall of the lateral recess while the object is rotated in the clockwise direction or in the counterclockwise direction.

13. The method of claim 12, further comprising accommodating the object in the lateral recess under a laterally-protruding clamp and restricting a vertical movement of the object by the laterally-protruding clamp.

14. The method of claim 13, further comprising: vertically moving the laterally-protruding clamp to make physical contact between the laterally-protruding clamp and an upper surface of a portion of the object after the object is inserted into the lateral recess.

15. The method of claim 13, further comprising providing the laterally-protruding clamp with a horizontal dimension that is in a range from 1 millimeter to 3 millimeters.

16. The method of claim 9, wherein the rotating comprises rotating the object alternatingly between the clockwise direction and the counterclockwise direction.

17. The method of claim 9, wherein the rotating comprises rotating the object at a rate of between 20 revolution-per-minute (RPM) to 50 RPM.

18. A method of etching, comprising:
   horizontally inserting an etchable object into a horizontally-facing slot of a holder, the etchable object including a photomask or a wafer;
   performing, in a dry etching chamber, a dry etching process to the etchable object after the inserting, wherein plasma is supplied to the dry etching chamber as a part of the dry etching process;
   redistributing the plasma throughout the dry etching chamber by spinning the holder in a clockwise direction for more than 360 degrees or in a counterclockwise direction for more than 360 degrees while the dry etching process is being performed; and
   restricting a lateral movement of the etchable object by a side wall of the horizontally-facing slot while the etchable object is being spun with the holder.

19. The method of claim 18, further comprising: positioning a horizontally-protruding clamp above a portion of the etchable object after the etchable object is inserted into the horizontally-facing slot.

20. The method of claim 18, wherein the spinning comprises spinning the holder in an alternating manner between the clockwise direction and the counterclockwise direction at a rate of between 20 revolution-per-minute (RPM) to 50 RPM.

* * * * *